United States Patent [19]

Moore

[11] 3,925,733

[45] Dec. 9, 1975

[54] MAXIMUM PULSE DENSITY DETECTOR

[75] Inventor: Wayne E. Moore, Oxon Hill, Md.

[73] Assignee: The United States of America as represented by the Secretary of the Navy, Washington, D.C.

[22] Filed: May 24, 1974

[21] Appl. No.: 473,049

[52] U.S. Cl. ................ 328/140; 307/233; 328/114; 329/103; 329/107; 329/135

[51] Int. Cl.$^2$ ........................ H03K 5/20; H03D 3/26

[58] Field of Search ........... 328/140, 110, 112, 113, 328/114, 109, 108; 307/233, 235 A, 271; 329/106, 107, 110, 112, 135, 102, 103, 104; 325/315

[56] References Cited

UNITED STATES PATENTS

| | | | |
|---|---|---|---|
| 2,914,672 | 11/1959 | Powell | 329/107 X |
| 3,155,912 | 11/1964 | Applebaum et al. | 329/107 X |
| 3,609,407 | 9/1971 | Garuts | 307/235 A |
| 3,611,157 | 10/1971 | Hughes | 329/106 UX |
| 3,766,411 | 10/1973 | Arnold | 328/114 X |

OTHER PUBLICATIONS

Hurel et al., "Fundamental Frequency Detector"– IBM Tech. Disclosure Bulletin, Vol. 11, No. 5, Oct., 1968, pp. 489–490.

Raesz et al., "Damped Peak Detector"—IBM Technical Disclosure Bulletin, Vol. 16, No. 9, Feb., 1964, pp. 2769–2770.

*Primary Examiner*—Alfred L. Brody
*Attorney, Agent, or Firm*—R. S. Sciascia; Arthur L. Branning; George A. Montanye

[57] ABSTRACT

An improved electronic circuit and technique for providing a trigger pulse synchronized with the maximum pulse density in a random pulse train. A frequency modulated pulse train having uniform amplitude pulses is delivered to an RC circuit which provides an output waveform having maximum amplitude at the highest input frequency or maximum pulse density. The waveform is passed through a smoothing filter and amplifier to more particularly define the waveform peak, and then to a peak detector where the point of maximum amplitude is sensed using a transistor sensing circuit. A pulse output from the transistor sensing circuit is electronically modified to produce an impulse trigger spike that corresponds to the point of maximum pulse density over a wide range of input conditions.

8 Claims, 9 Drawing Figures

MAXIMUM PULSE DENSITY DETECTOR

BACKGROUND OF THE INVENTION

The present invention relates to improvements in pulse triggering circuits and more particularly to improvements in triggering circuits for synchronizing system operation with the point of maximum pulse density in a random pulse train.

In many data collection systems there is presently a need for increased accuracy and higher reliability in triggering circuits responding to random frequency inputs having periods of peak densities. Even where the peak densities generally have a fixed time relationship relative to one another, there is still a need for accurate triggering where the periods of peak density may not be stable in time relative to a known synchronizing signal. Such need is encountered in instrument systems using a multichannel scaler (MCS), multichannel analyzer, signal averager, probability analyzer, or virtually any time domain instrument where the instrument must be repetitively and accurately triggered in fixed relationship to a signal to be observed.

In one particular optical system an MCS must be triggered in response to the periods of maximum light intensity as indicated by a frequency modulated train of uniform (amplitude and width) pulses from a photomultiplier tube. The regions of peak intensity correspond to the regions of maximum pulse density from which it is desired to obtain a triggering signal. In this particular example, the intensity peaks are fixed relative to one another but vary in time relative to a timing signal controlling the optical instrument due to drifts caused by temperature variations. It is therefore necessary to be able to detect the points of peak densities regardless of when they occur so that the sweep of MCS can be accurately triggered.

In prior known techniques the pulse train was used to form a waveform envelope whose amplitude increased and decreased as the density increased and decreased. Using a normal oscilloscope, the detected envelope could then be used to genertae a trigger pulse when the amplitude of the envelope crossed a preset DC threshold. This is a simple technique but is not satisfactory for signal averaging or MCS type processing largely because of the time uncertainty (jitter) introduced by variations in the amplitude of the detected envelope and the shape of the detected envelope both of which are dependent on the frequency characteristics of the pulse train input. In systems of this type the pulse train is random even during periods of peak intensity and the density may vary in total count so as to produce as much as 20 db or more variations in the amplitude of the detected envelope in addition to wide variations in envelope shape. As a result, no two peaks of the detected envelope will ever be the same leading to large trigger error or no triggering at all.

Accordingly, the present invention has been developed to overcome the specific shortcomings of the above known and similar techniques and to provide a more precise and reliable circuit for triggering at maximum density of a random pulse train.

SUMMARY OF THE INVENTION

It is therefore an object of the present invention to provide an improved electronic triggering circuit.

Another object of the invention is to provide a circuit for accurately detecting maximum pulse density in a random pulse train.

A further object of the invention is to provide a highly reliable triggering circuit synchronized with the point of maximum pulse density in a random pulse train.

Still another object of the invention is to provide synchronized triggering over a wide range of input conditions which is less sensitive to input fluctuations.

In order to accomplish the above and other objects, a frequency modulated train of uniform pulses is fed to an RC integrating network to form an amplitude waveform from the pulse train. The waveform will vary in amplitude with the varying frequency and have maximum amplitude at the points of maximum pulse density. In order to reduce irregularities in the waveform and more particularly define the amplitude (pulse density) peaks, the waveform is passed through a low-pass smoothing filter and amplified. The smoothed waveform is then fed to a transistor sensing circuit where the peak amplitude is detected by sensing the change of the amplitude from increasing to decreasing. Because a change in amplitude is detected rather than an absolute value of amplitude, the point of maximum pulse density is accurately fixed in spite of wide variations in pulse frequency which otherwise cause large irregularities in the shape of the detected envelope. A voltage output from the transistor sensing circuit is reshaped to form a square wave which is then differentiated to provide an impulse trigger that essentially corresponds in time to the point of maximum pulse density of the input data train. since the trigger pulse is not dependent on waveform amplitude, trigger jitter (time uncertainty) is greatly reduced and variations in the input data train are automatically compensated for.

Other objects, advantages, and novel features of the invention will become apparent from the following detailed description of the invention when considered in conjunction with the accompanying drawings wherein:

DETAILED DESCRIPTION OF THE PREFERRED EMBODIMENT

Figures 1, 3A, 3B, 3C, 3D, 3E, 3F, 3G:
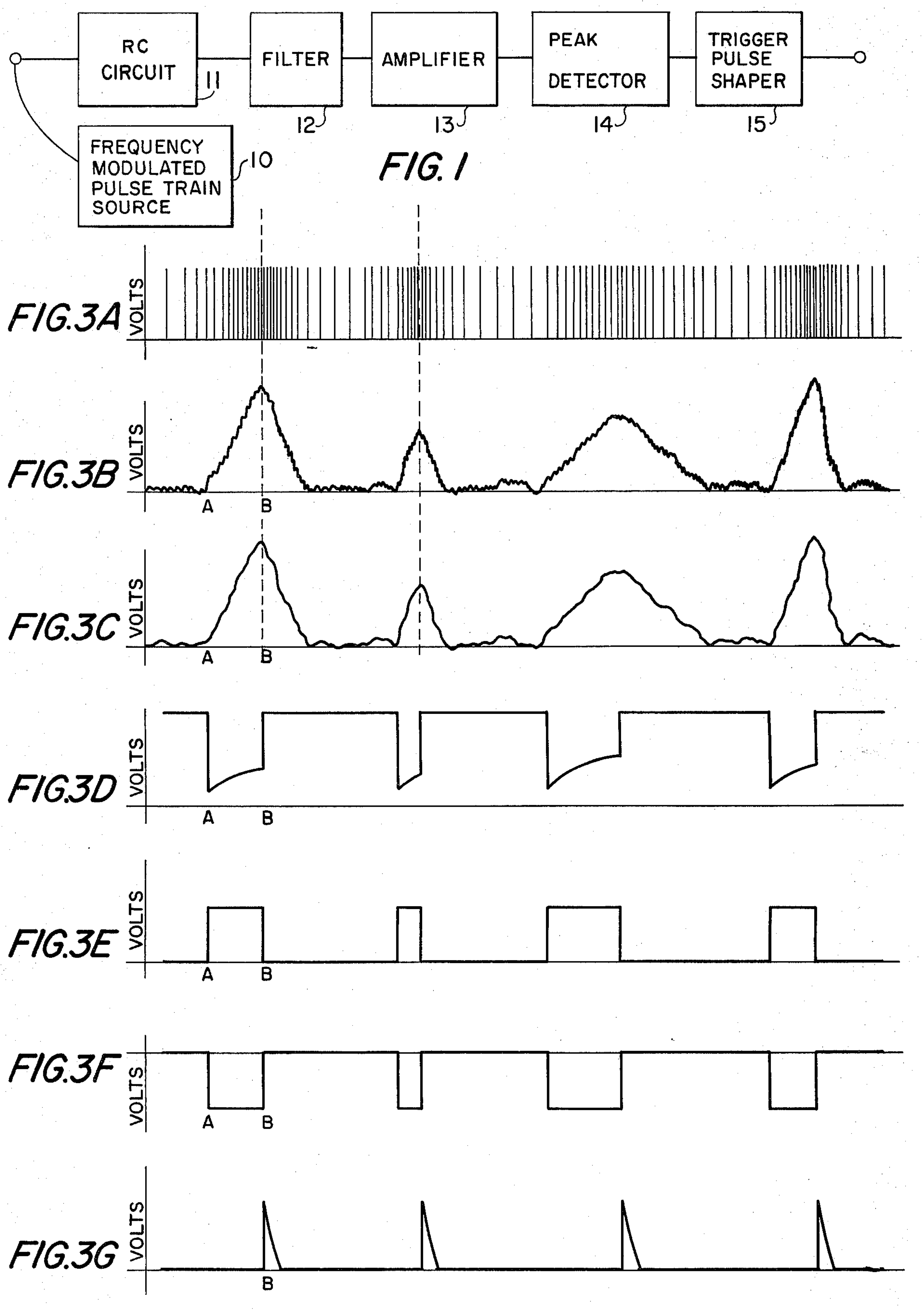
FIG. 1 is a block diagram showing the arrangement of the circuit elements according to the present invention.
FIGS. 3A–3G illustrate signal characteristics at various points in the circuit of FIG. 2 during circuit operation.

Referring to FIG. 1, a block diagram of the present invention shows the basic arrangement of the elements forming the improved pulse density trigger circuit. The circuit is generally formed from an RC circuit 11 which receives a frequency modulated train of uniform pulses from source 10 and forms a waveform whose amplitude increases with increasing pulse repetition frequency. The output from circuit 11 is fed to a filter 12 which smoothes the ragged waveform formed at 11. The waveform is further defined by amplifier 13 and passed to peak detector 14. Peak detector 14 senses the peak amplitude of the waveform (and therefore the maximum pulse density) and provides a voltage output indicative thereof. The voltage output is then shaped by the trigger pulse shaper 15 to provide an impulse trigger synchronized with the peaks of maximum pulse density of the random data train.

Figure 2:
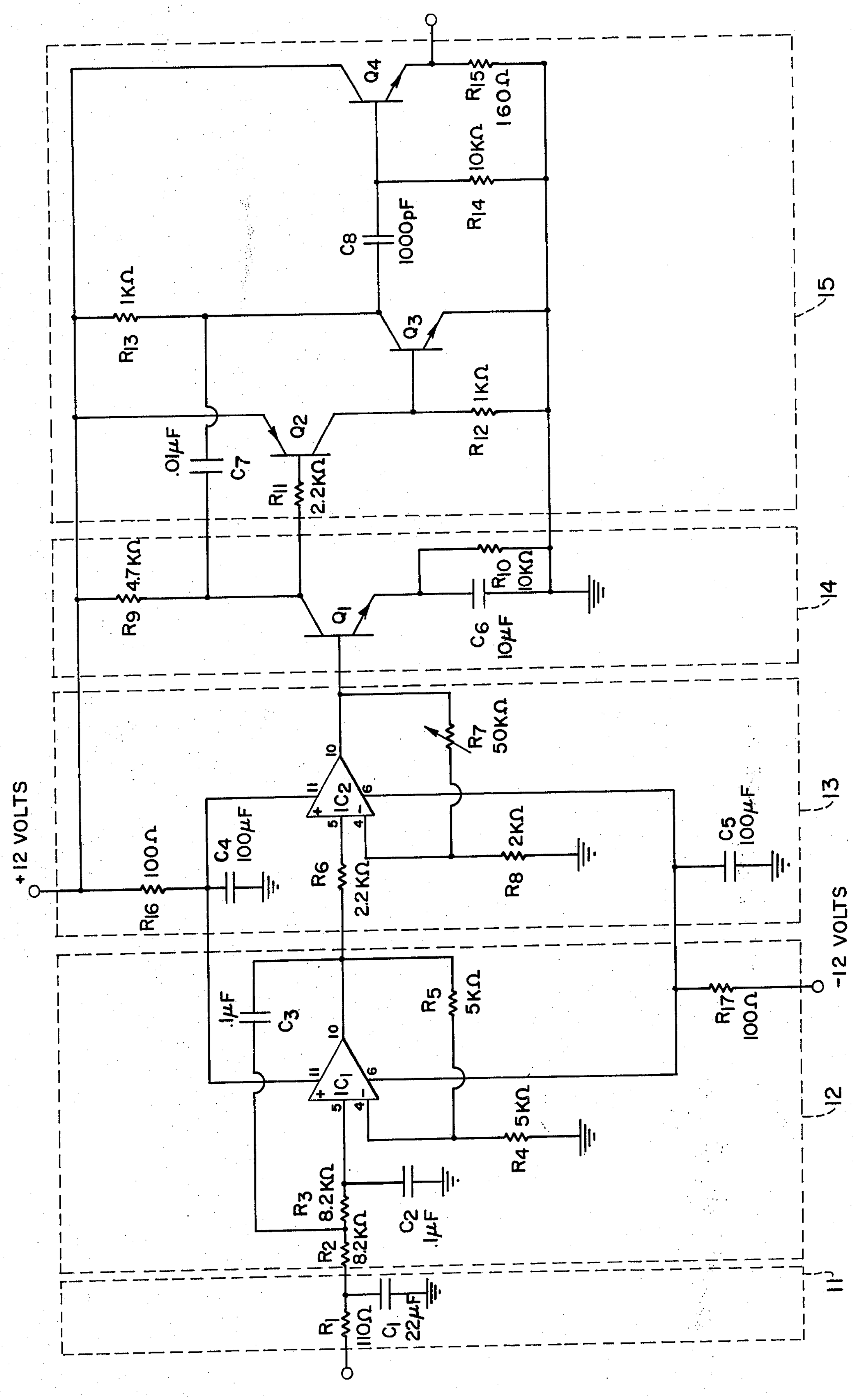
FIG. 2 is a schematic diagram of a preferred embodiment of the system of FIG. 1 particularly showing the construction of the individual circuits.

Turning to FIG. 2, the individual circuits forming the preferred embodiment are shown in more specific form. Circuit 11 is generally an RC integrating circuit shown by resistor $R_1$ and capacitor $C_1$. The output of 11 is a waveform whose amplitude increases as the input pulse frequency (pulse density) increases. Filter 12, connected to receive the output from circuit 11, is formed from a well known integrated circuit $IC_1$ designed to form a simple second order low-pass active filter. In the present example the filter is formed from a Fairchild IC $\mu$-A741 with the resistors $R_2$–$R_5$ and capacitors $C_2$–$C_3$ connected as shown to provide a frequency cutoff of 200Hz and a gain of 2. Connected to the output of filter 12 is a non-inverting amplifier 13 designed to provide a variable gain from 1–25 to handle a wide variety of input signal amplitudes. Resistors $R_6$–$R_8$ are connected to $IC_2$ (a Fairchild IC $\mu$A741) to provide the proper connections for achieving the correct gain. In addition, resistors $R_{16}$ and $R_{17}$ and capacitors $C_4$ and $C_5$ are connected to provide decoupling of possible high frequency spike noise from the rest of the circuit. While specific pin connections and polarities of the particular IC's used are shown in the drawing, it is obvious that the low-pass filter and amplifier can be constructed from integrated circuit operational amplifiers of similar specifications.

Connected to the output of amplifier 13 is the transistor peak detector circuit 14 generally formed from an NPN transistor $Q_1$ (2N3904). The base of $Q_1$ is connected to the output from $IC_2$ to receive the filtered and amplified envelope from 11. Resistor $R_9$ is connected in series to the positive 12 volt power source and to the collector of $Q_1$ while the parallel combination of capacitor $C_6$ and resistor $R_{10}$ are connected to form a charging circuit in series with the emitter of $Q_1$ and ground. The output from the detector circuit 14 is taken from the collector of $Q_1$ and fed to the base of PNP transistor $Q_2$ (2N3906) forming the input to the trigger pulse shaper 15. The emitter of $Q_2$ is connected directly to the 12 volt power source while the collector is connected through resistor $R_{12}$ to ground. The output from $Q_2$ is taken from the collector and fed to the base of NPN transistor $Q_3$ (2N3904). The emitter of $Q_3$ is connected directly to ground while the collector is connected through resistor $R_{13}$ to the positive 12 volt power source. Capacitor $C_7$ is connected to the collector of $Q_3$ as well as to the collector of $Q_1$ to provide a feedback path. The output from $Q_3$ is taken from the collector and fed to a differentiating circuit formed from capacitor $C_8$ and resistor $R_{14}$. One lead of the capacitor $C_8$ is connected to the base of NPN transistor $Q_4$ (2N3904 ) with resistor $R_{14}$ connected between the base and ground. Transistor $Q_4$ is connected as an emitter follower having the collector connected directly to the positive power source and the emitter connected through resistor $R_{15}$ to ground. The output from the shaper 15 is taken from the emitter of transistor $Q_4$.

The operation of the circuit will now be described with particular reference to the waveform of FIG. 3. In the present example a data pulse train such as that shown in FIG. 3A is fed to the input of the circuit 11. The input data is a random train of positive uniform (amplitude and width) pulses the relative spacing (frequency) of which becomes more or less dense in response to some external condition. The nature of the pulse train might be such that various periods of maximum density occur but each period may exhibit different pulse densities relative to any other as shown in FIG. 3A. In cases where the pulse train is formed from pulses that are not of uniform amplitude and width, the pulse train should be passed through any well known pulse shaping circuit to provide uniform amplitude and width prior to being fed to the circuit 11.

The $R_1C_1$ integrating circuit is connected to receive the pulse train for forming a waveform from the frequency modulated pulse train. During periods of low pulse rate (frequency) $C_1$ charges very little, resulting in a voltage profile at the output of $C_1$ of very low magnitude. However, as the pulse rate increases in the area of high pulse densities, $C_1$ is charged faster than it can discharge resulting in a rough positive voltage waveform defining the high density portions of the pulse train. The waveform can best be seen in FIG. 3B as a ragged waveform having peaks that substantially correspond to the points of maximum pulse density in the random data train. Even through the waveform peaks are ragged due to high frequency noise components they can still be used to provide a rough approximation for setting the filter frequency necessary to filter out the high frequency noise. In the present example the width of the waveform peaks was approximated at 5ms. The filter frequency was then set at a frequency cutoff of 200Hz which is approximately twice the highest frequency of a sine wave obtained by assuming the waveforms of 5ms width is one-half cycle of a sinusoid. The filter according to the present invention thereafter receives the waveform of FIG. 3B from 11 and smoothes the output so that the peaks are more accurately defined as shown by the smoothed waveform of FIG. 3C. The envelope of FIG. 3C is then fed to the non-inverting amplifier 13 to even more distinctly define the waveform peaks before being fed to the input of peak detector 14 through the base of transistor $Q_1$.

During the time that the pulse rate is so low as to fail to produce any substantial voltage output from the circuit 11, transistor $Q_1$ is in the cutoff condition and generally provides a constant voltage output proportional to the bias source. However, as the pulse rate increases such that a positive voltage magnitude is delivered from the amplifier 13 (as at point A in FIG. 3C) $Q_1$ is driven to saturation causing the collector voltage to rapidly drop toward zero (as at A in FIG. 3D). At the same time $C_6$ begins to charge and the collector tends to follow the filtered envelope until the peak of the waveform is reached (B in FIG. 3C). At the peak of the filtered waveform (point of maximum pulse density) the base becomes reversed biased due to the positive voltage built up across capacitor $C_6$. This, in combination with the feedback from $C_7$, causes transistor $Q_1$ to rapidly turn off (B in FIG. 3D). $R_{10}$ thereafter discharges the voltage on $C_6$. The point B is defined by the trailing edge of the waveform output from the collector of $Q_1$ as shown by FIG. 3D and represents the point of maximum pulse density.

The pulse output from $Q_1$ is then fed through $R_{11}$ to the base transistor $Q_2$. Transistor $Q_2$ shapes the output pulse from $Q_1$ to form a square wave pulse at the collector output, as shown by FIG. 3E, whose trailing edge also corresponds to the point of maximum pulse density. This pulse is in turn passed to transistor $Q_3$ which inverts the output of $Q_2$ to form a square wave pulse output at the collector of $Q_3$ as shown in FIG. 3F. The output from $Q_3$ is then differentiated by the capacitor resistor combination $C_8$, $R_{14}$, to produce a positive impulse trigger spike as shown by FIG. 3G which corresponds in time to the peak pulse density of the input data train. The spike is then passed through the emitter follower of $Q_4$ to enable the circuit to be coupled to any low impedance load.

Using the circuit shown in FIG. 2, along with the designated element values and input pulses having a 5 volt amplitude, 1 $\mu$ sec width, and upwards of 50ns rise time, a 5 volt trigger pulse having an 8 ns rise time was obtained at the output of the emitter follower. Obviously by adjusting the various biasing and circuit values, the circuit could be designed to handle a wide variety of input pulse parameters or produce different characteristics in the trigger pulse.

As can be seen from the above description, the above circuit is capable of providing an accurate trigger pulse for a wide variety of input conditions and which is synchronous with the peak density of the input pulse trains. Contrary to prior techniques where the trigger pulse was initiated at some set DC level, the present system insures that the trigger pulse only occurs at a peak in the pulse density. The triggering is therefore less sensitive to fluctuations in the input data which cause variations in the amplitude and shape of the waveform. In practice, the waveform may suffer 20 db variations (10 to 1 ratio of maximum waveform peak to minimum waveform peak) and still provide highly reliable triggering. Since the waveform amplitude is directly related to input frequency, a wide range of input frequencies can be accommodated for which the peaks will be accurately formed.

An important advantage of the present invention can be seen with reference to FIG. 3A. Even during periods of peak density the pulse spacing (frequency) is still random and the envelope peaks are not all alike in shape. (FIGS. 3B and 3C) Hence, while the trigger pulse is not influenced by amplitude variations, the random nature of the data pulses creates shifts in the shape of the waveform that normally cause jitter (time uncertainty) in the trigger pulse. In prior known methods the jitter would produce trigger pulses that would vary by as much as 50 percent or more of the envelope width and would fail altogether if amplitude fluctuations (frequency range) were greater than 3db. The present system, however, reduces the jitter to less than 10 percent of the width of the detected envelope peaks. This results in increased accuracy in triggering enabling more reliable data collection. In addition, since the triggering pulse follows the peak pulse density, any change in operating characteristics causing shifts in frequency of the input data train, will be automatically compensated for in the trigger circuit.

In the present example the circuit was used to trigger an MCS in synchronism with the Raleigh Peaks from a swept Fabry-Perot interferometer. The Raleigh Peaks were generally indicated by an output pulse train from a photomultiplier tube designed to measure light intensity. The output pulse train was a series of uniform (amplitudes and width) but random pulses whose frequency increased with a corresponding increase in light intensity. In the present case, a repetitive ramp sweep stimulus provided two peaks (periods of maximum density) during each ramp period that greatly occurred in fixed time relation to one another but were subject to variations in time of occurrence, caused by temperature drift, during any particular ramp sweep. Using the present circuit, accurate triggering pulses were delivered synchronously with the occurrence of the Raleigh Peaks during each sweep.

In addition to providing the above benefits, the present circuit uses simple and inexpensive elements well known in the art. Further, the RC integrator can be set to optimize the amplitude characteristics of the waveform in consideration of the input pulse height and width and the range of frequency anticipated. By further adjusting the filter bandwidth, even more control of frequency selectively can be obtained resulting overall in a highly versatile triggering device.

While the invention has been described with reference to particular values and elements, it is evident that the same could be varied consistent with the present teachings to meet a variety of input conditions. Likewise, while the invention is particularly designed to provide accurate triggering with a random modulating frequency, the same is equally effective with a periodically modulated pulsed input.

Obviously many other modifications and variations of the present invention are possible in light of the above teachings. It is therefore to be understood that within the scope of the appended claims, the invention may be practiced otherwise than as specifically described.

What is claimed and desired to be secured by Letters Patent of the U.S. is:

1. An improved circuit for providing a trigger pulse synchronous with the maximum pulse density in a frequency modulated pulse train comprising:

- means for providing a frequency modulated pulse train having periods of maximum pulse density;
- means for forming a waveform from said pulse train, said waveform having an amplitude proportional to the frequency of said pulse train;
- means coupled to said forming means for defining peak amplitudes of said waveform;
- means coupled to said defining means for sensing the peak amplitudes of said waveform; and
- means responsive to said sensing means for providing a trigger pulse upon the sensing of a peak amplitude.

2. The circuit of claim 1 wherein said providing means provides a random frequency pulse train having pulses of uniform amplitude and width.

3. The circuit of claim 2 wherein said means for forming comprises a resistor-capacitor integrating network connected to receive the pulse train and provide an envelope output whose amplitude increases with increases in frequency.

4. The circuit of claim 3 wherein said defining means comprises a low-pass filter and amplifier connected to receive said waveform to smooth and amplify said peaks.

5. The circuit of claim 4 wherein said sensing means comprises a transistor connected to provide a pulse output having a trailing edge corresponding to each peak of said waveform.

6. The circuit of claim 5 wherein said trigger providing means comprises:

- a first transistor connected to receive said pulse output and form a square wave pulse corresponding in period to said pulse output;
- a second transistor connected to receive said square wave pulse and provide an inverted square wave output;

a differentiating circuit connected to receive said inverted output and provide a voltage impulse from the trailing edge of said inverted square wave, and;

an emitter follower connected to pass said voltage impulse.

7. The circuit of claim 5 wherein said transistor has its base coupled to receive said waveform and its collector and emitter biased to provide said trailing edge pulse output when the amplitude of the waveform at the base reaches a peak value.

8. A pulse density trigger circuit comprising:

means for providing a frequency modulated pulse train having periods of maximum pulse density;

means responsive to said pulse train for providing an output waveform having points of maximum amplitude at times of maximum pulse density;

means for sensing the points of maximum amplitude of said waveform; and means responsive to said sensing means for providing a trigger pulse substantially corresponding in time to each point of maximum amplitude of said waveform.

* * * * *